(12) United States Patent
Otremba et al.

(10) Patent No.: US 8,643,176 B2
(45) Date of Patent: Feb. 4, 2014

(54) POWER SEMICONDUCTOR CHIP HAVING TWO METAL LAYERS ON ONE FACE

(75) Inventors: Ralf Otremba, Kaufbeuren (DE); Josef Hoeglauer, Heimstetten (DE); Juergen Schredl, Mering (DE); Xaver Schloegel, Sachsenkam (DE)

(73) Assignee: Infineon Technologies AG, Neubiberg (DE)

( * ) Notice: Subject to any disclaimer, the term of this patent is extended or adjusted under 35 U.S.C. 154(b) by 116 days.

(21) Appl. No.: 13/191,891

(22) Filed: Jul. 27, 2011

(65) Prior Publication Data
US 2013/0027113 A1 Jan. 31, 2013

(51) Int. Cl.
*H01L 23/66* (2006.01)
(52) U.S. Cl.
USPC .......................................... 257/728
(58) Field of Classification Search
USPC ......... 257/676, 690, 290, 728, 734, 735, 738, 257/777
See application file for complete search history.

(56) References Cited

U.S. PATENT DOCUMENTS

| 5,761,040 | A   | * | 6/1998  | Iwasa et al. ................. 361/704 |
| 6,803,667 | B2  | * | 10/2004 | Okura et al. ................. 257/792 |
| 7,045,884 | B2  | * | 5/2006  | Standing ...................... 257/678 |
| 7,482,681 | B2  | * | 1/2009  | Standing ...................... 257/678 |
| 7,732,929 | B2  |   | 6/2010  | Otremba et al. |
| 7,804,131 | B2  | * | 9/2010  | Cheah et al. .................. 257/341 |
| 7,879,455 | B2  | * | 2/2011  | Kajiwara et al. ............. 428/620 |
| 2004/0061221 | A1 | * | 4/2004 | Schaffer ........................ 257/723 |
| 2004/0262720 | A1 | * | 12/2004 | Satou et al. .................... 257/676 |
| 2005/0121784 | A1 | * | 6/2005 | Standing ....................... 257/737 |
| 2005/0263880 | A1 | * | 12/2005 | Igarashi et al. ............... 257/723 |
| 2007/0132079 | A1 |   | 6/2007 | Otremba et al. |
| 2007/0181908 | A1 |   | 8/2007 | Otremba |
| 2008/0048342 | A1 | * | 2/2008 | Cheah et al. .................. 257/777 |
| 2009/0008758 | A1 |   | 1/2009 | Lu et al. |
| 2009/0039484 | A1 | * | 2/2009 | Mahler et al. ................ 257/676 |
| 2009/0072413 | A1 |   | 3/2009 | Mahler et al. |
| 2011/0024917 | A1 |   | 2/2011 | Bhalla et al. |
| 2011/0115062 | A1 | * | 5/2011 | Yokoe et al. .................. 257/676 |

FOREIGN PATENT DOCUMENTS

| DE | 19835265 A1 | 2/2000 |
| DE | 102005055761 A1 | 5/2007 |
| DE | 102007006447 A1 | 8/2007 |
| DE | 102008039389 A1 | 4/2009 |

OTHER PUBLICATIONS

German Office Action for Application No. 102012106566.7; mailed Aug. 6, 2013; 6 pages.

* cited by examiner

*Primary Examiner* — Nathan Ha
(74) *Attorney, Agent, or Firm* — Slater & Matsil, L.L.P.

(57) ABSTRACT

A semiconductor chip includes a power transistor circuit with a plurality of active transistor cells. A first load electrode and a control electrode are arranged on a first face of the semiconductor chip, wherein the first load electrode includes a first metal layer. A second load electrode is arranged on a second face of the semiconductor chip. A second metal layer is arranged over the first metal layer, wherein the second metal layer is electrically insulated from the power transistor circuit and the second metal layer is arranged over an area of the power transistor circuit that comprises at least one of the plurality of active transistor cells.

24 Claims, 8 Drawing Sheets

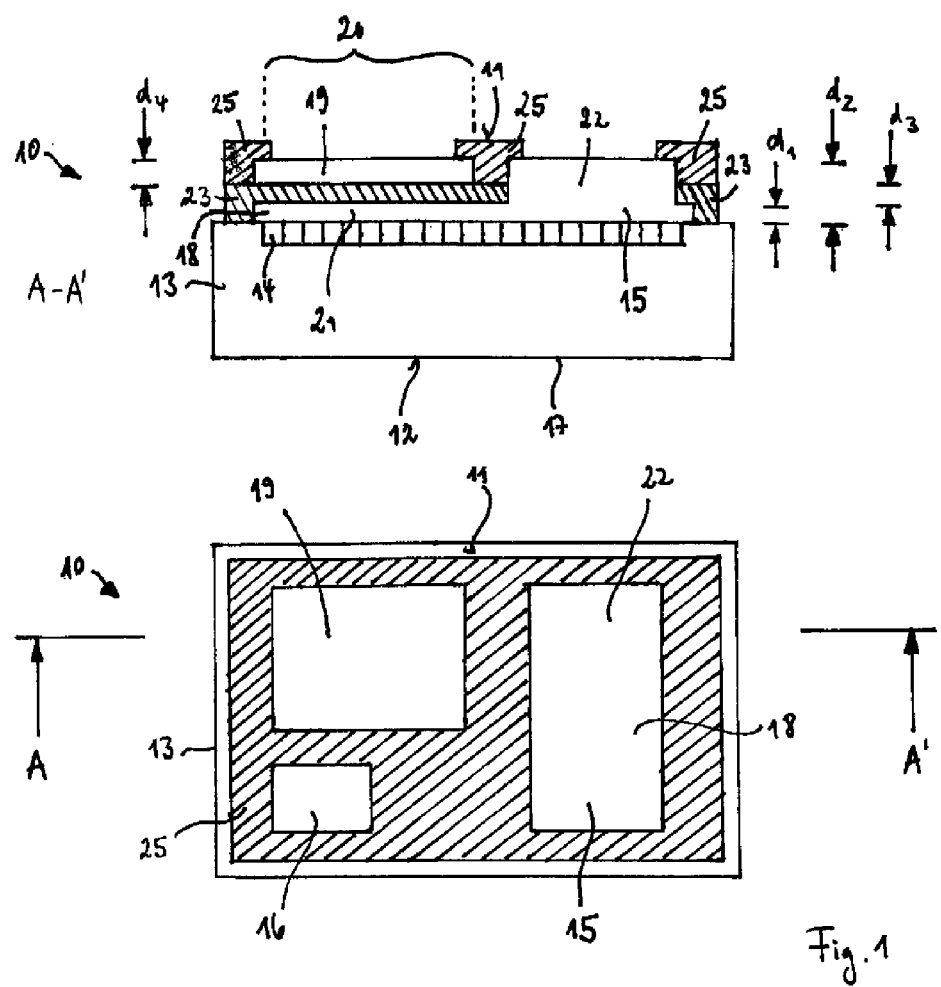
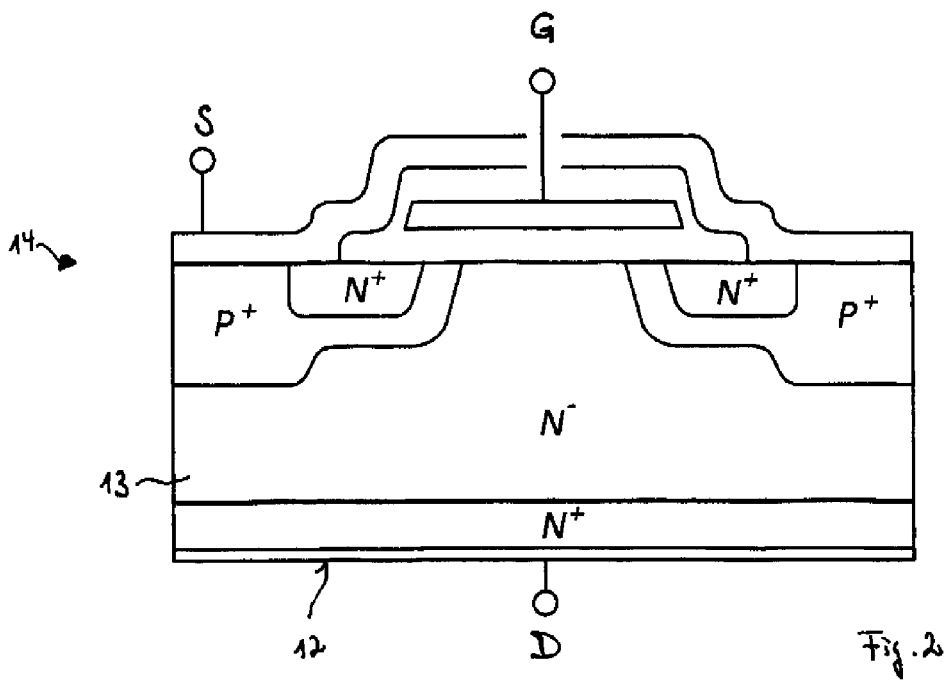

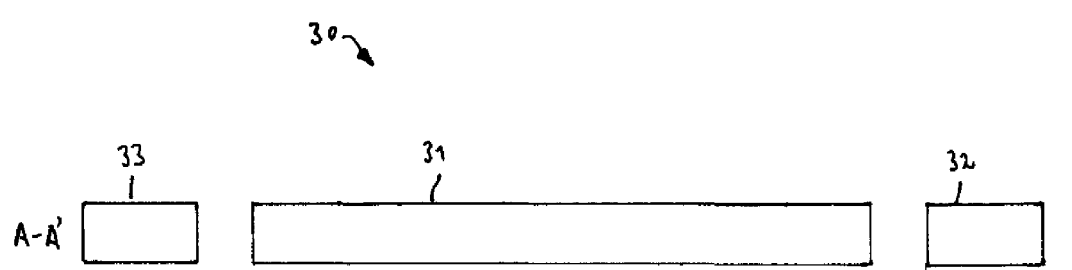
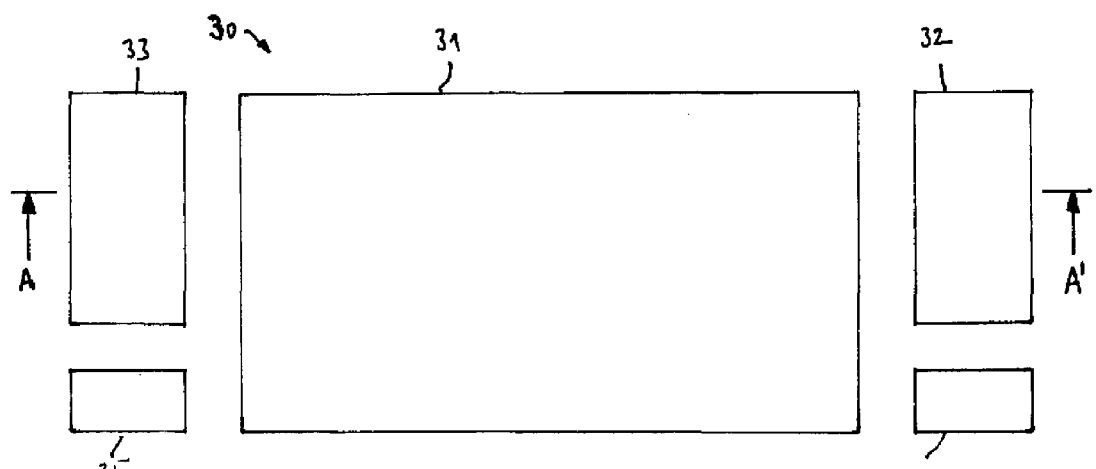
Fig. 3A

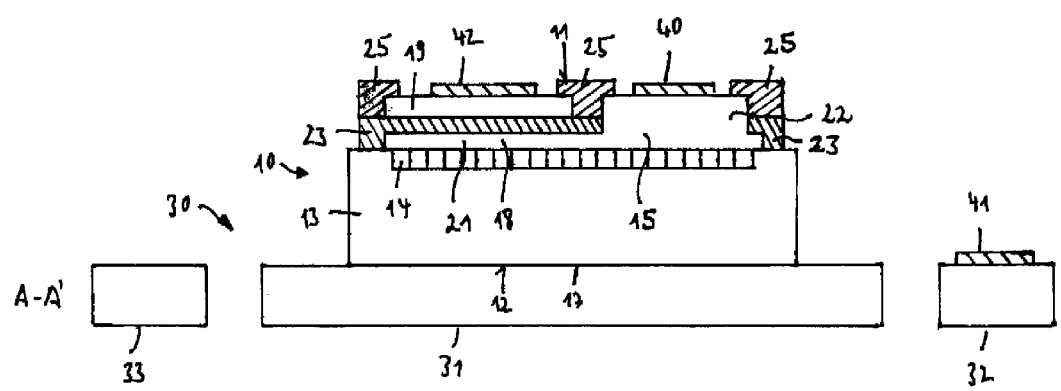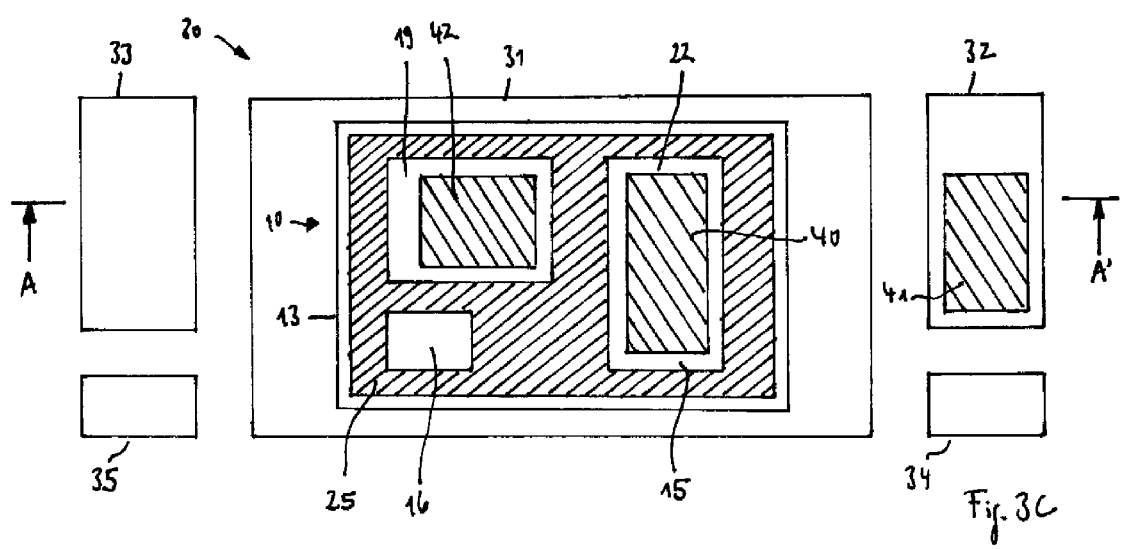
Fig. 3C

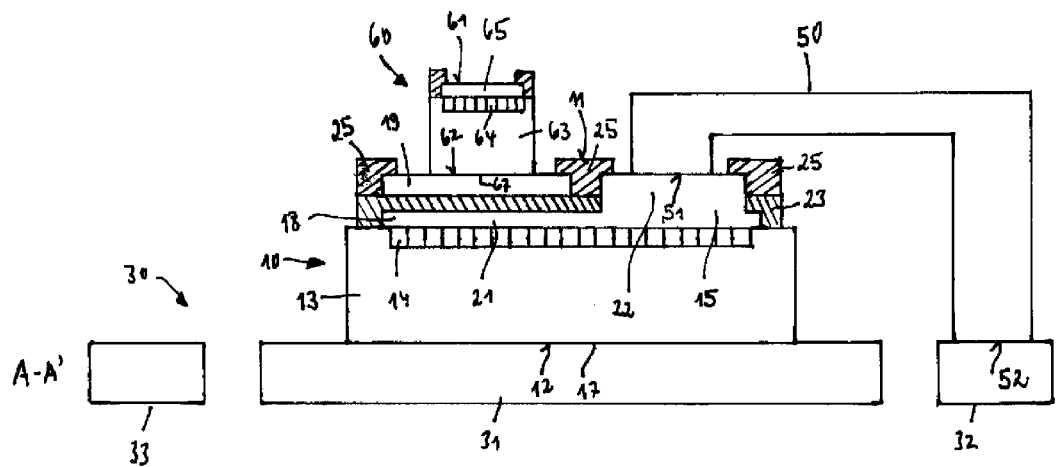
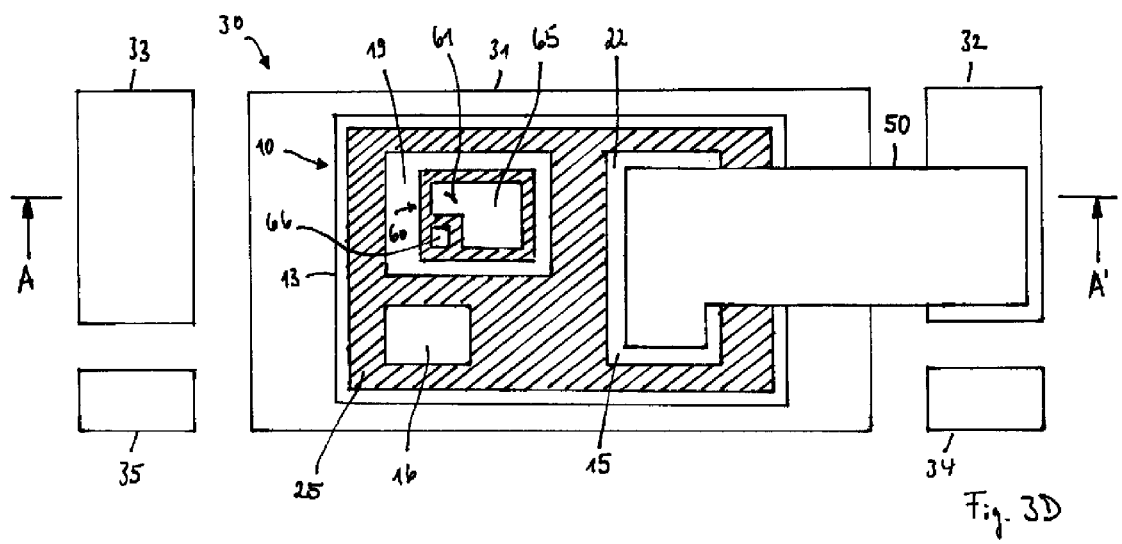
Fig. 3D

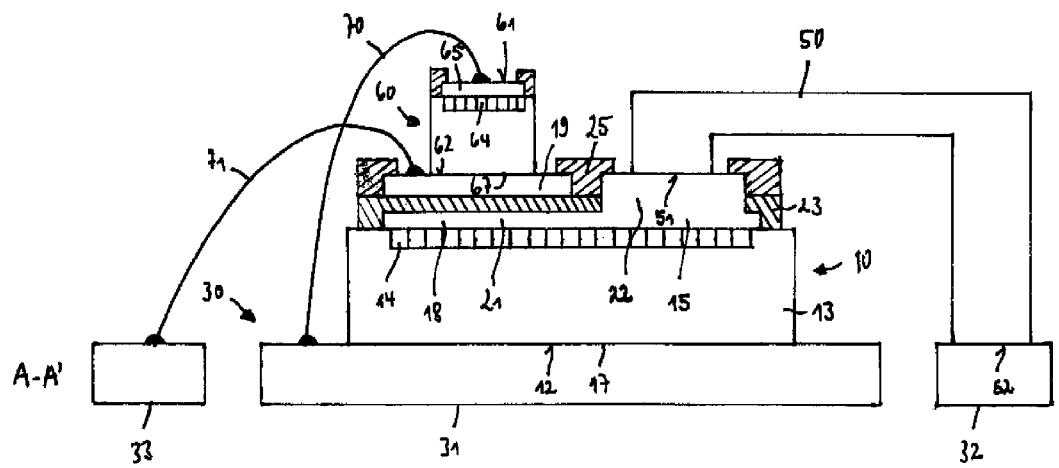
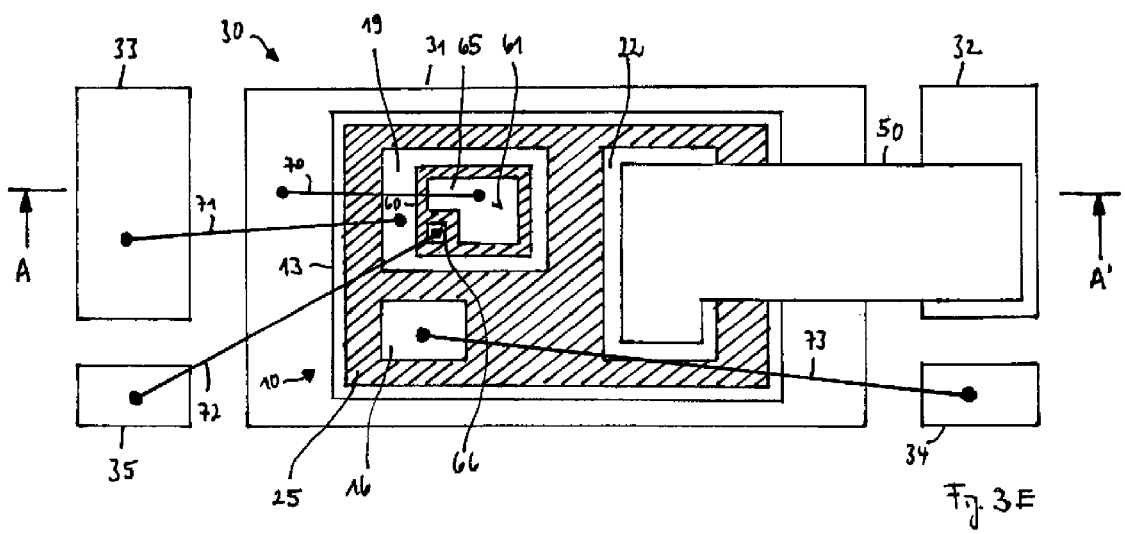
Fig. 3E

US 8,643,176 B2

POWER SEMICONDUCTOR CHIP HAVING TWO METAL LAYERS ON ONE FACE

TECHNICAL FIELD

This invention relates to a power semiconductor chip having two metal layers on one face of the power semiconductor chip.

BACKGROUND

A power semiconductor chip is a specific type of semiconductor chip designed to handle significant power levels. Power semiconductor chips are suitable, in particular, for the switching or control of currents and/or voltages. They may be implemented as power MOSFETs, IGBTs, JFETs or power bipolar transistors. Power semiconductor chips can be found in most power supplies, DC to DC converters and motor controllers.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 schematically illustrates a cross-sectional and top plan view of one embodiment of a semiconductor chip including a power transistor circuit with two metal layers deposited over active transistor cells;

FIG. 2 schematically illustrates a cross-sectional view of one embodiment of a transistor cell;

FIGS. 3A-3F schematically illustrate a cross-sectional and top plan view of one embodiment of a method of manufacturing a device including mounting a first power semiconductor chip on a leadframe and stacking a second power semiconductor chip on top of the first power semiconductor chip;

DETAILED DESCRIPTION OF ILLUSTRATIVE EMBODIMENTS

Figure 3B:
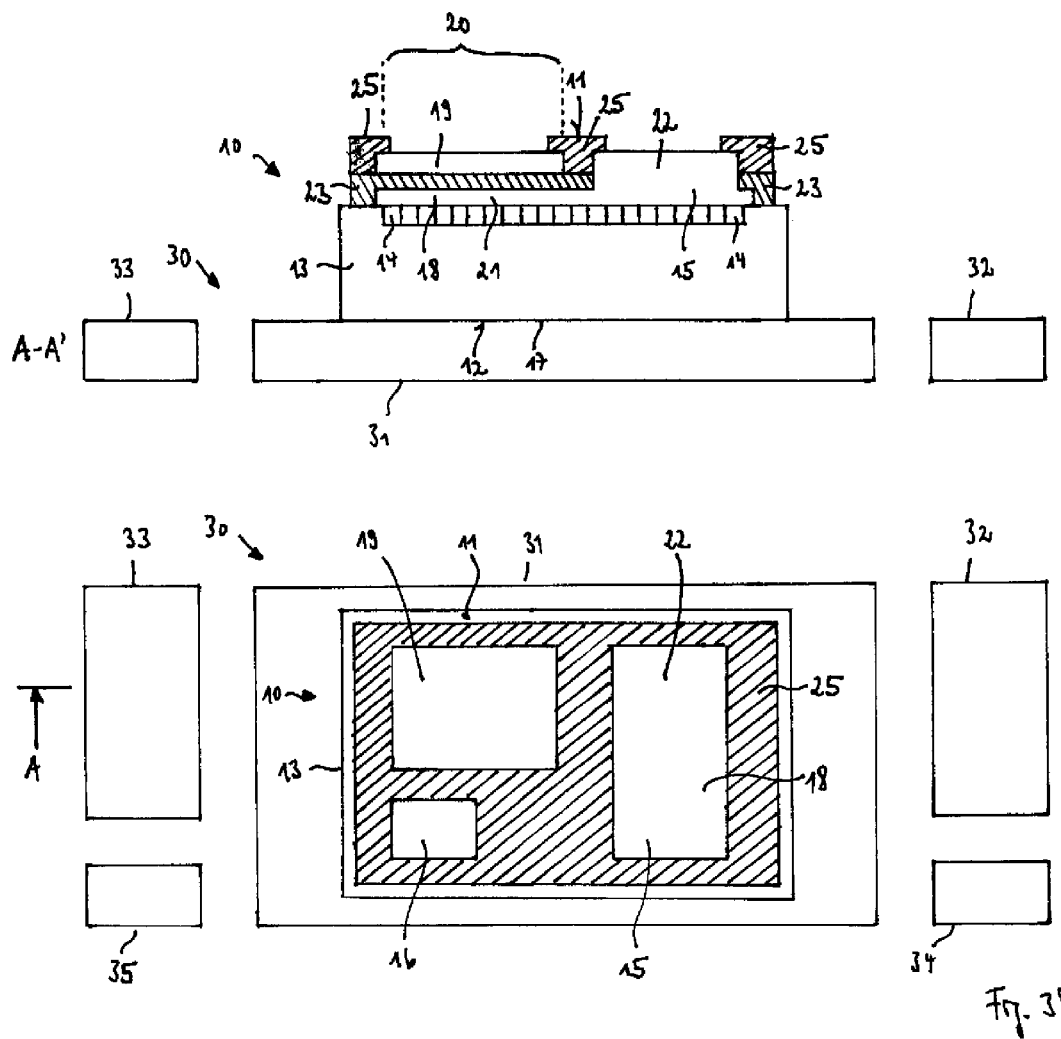

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (Micro-Electro Mechanical Systems) and may include micro-mechanical structures, such as bridges, membranes or tongue structures. The semiconductor chips may be configured as sensors or actuators, for example, pressure sensors, acceleration sensors, rotation sensors, magnetic field sensors, electro-magnetic field sensors, microphones etc. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure has electrodes on its two main faces, that is to say on its top side and bottom side. In particular, power semiconductor chips may have a vertical structure. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors) or power bipolar transistors. By way of example, the source electrode and gate electrode of a power MOSFET may be situated on one main face, while the drain electrode of the power MOSFET is arranged on the other main face. Furthermore, the devices described below may include integrated circuits to control the integrated circuits of power semiconductor chips.

The semiconductor chips may have electrodes (or contact elements or contact pads) which allow electrical contact to be made with the integrated circuits included in the semiconductor chips. The electrodes may include one or more metal layers that are applied to the semiconductor substrate. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips may be placed on leadframes. The leadframes may be of any shape, size and material. The leadframes may include die pads and leads. During the fabrication of the devices the die pads and leads may be connected to each other. The die pads and leads may also be made from one piece. The die pads and leads may be connected among each other by connection means with the purpose of separating some of the die pads and leads in the course of the fabrication. Separation of the die pads and leads may be carried out by mechanical sawing, a laser beam, cutting, stamping, milling, etching or any other appropriate method. The leadframes may be electrically conductive. They may be entirely fabricated from metals or metal alloys, in particular, copper, copper alloys, iron nickel, aluminum, aluminum alloys, steel, stainless steel or other appropriate materials. The leadframes may be plated with an electrically conductive material, for example, copper, silver, iron nickel or nickel phosphorus. The leads of the leadframes may be bent during fabrication, for example, in an S-shaped manner.

The devices described below include external contact elements (or external contact pads), which may be of any shape and size. The external contact elements may be accessible from outside the device and may thus allow electrical contact to be made with the semiconductor chips from outside the device. For this reason, the external contact elements may have external contact surfaces which can be accessed from outside the device. Furthermore, the external contact elements may be thermally conductive and may serve as heat sinks for dissipating the heat generated by the semiconductor chips. The external contact elements may be composed of any desired electrically conductive material, for example, of a metal, such as copper, aluminum or gold, a metal alloy or an electrically conducting organic material. The external contact elements may be leads of a leadframe.

The devices may include an encapsulation material, for example, a mold material covering at least parts of the components of the devices. The mold material may be any appropriate thermoplastic or thermosetting material. Various techniques may be employed to cover the components with the mold material, for example, compression molding, injection molding, powder molding or liquid molding.

FIG. 1 schematically illustrates a power semiconductor chip 10 in a top plan view (bottom) and a cross-sectional view (top) along a line A-A' depicted in the top plan view. The power semiconductor chip 10 has a first face 11 and a second face 12 opposite to the first face 11. The power semiconductor chip 10 includes a semiconductor substrate 13 and a power transistor circuit that is integrated in the semiconductor substrate 13 and includes a plurality of active transistor cells 14. In addition, the power semiconductor chip 10 includes a first load electrode 15 and a control electrode 16 arranged on the first face 11 and a second load electrode 17 arranged on the second face 12. The first load electrode 15 includes a first metal layer 18. A second metal layer 19 is arranged over the first metal layer 18 and is electrically insulated from the power transistor circuit. Further, the second metal layer 19 is arranged over an area 20 of the power transistor circuit that includes one or more of the active transistor cells 14. In other words, one or more of the active transistor cells 14 are within a projection of the second metal layer 19 on the semiconductor substrate 13 orthogonal to the first face 11.

In one embodiment, the first metal layer 18 has a first portion 21 with a first thickness $d_1$ that is smaller than a second thickness $d_2$ of a second portion 22 of the first metal layer 18. The first thickness $d_1$ is in the range from 1 to 10 μm and, in particular, in the range from 5 to 10 μm. The second thickness $d_2$ is in the range from 5 to 15 μm and, in particular, in the range from 10 to 15 μm. In one embodiment, the difference $d_2-d_1$ of the two thicknesses $d_1$ and $d_2$ is in the range from 3 to 8 μm and, in particular, in the range from 4 to 6 μm.

The first metal layer 18 may include one or more metal layers that are applied to the semiconductor substrate 13. Any desired metal or metal alloy, for example, aluminum, nickel or copper may be used as the material. The first metal layer 18 need not be homogenous or manufactured from just one material, that is to say various compositions and concentrations of the materials contained in the first metal layer 18 are possible.

A dielectric layer 23 is deposited on the first metal layer 18. In one embodiment, the dielectric layer 23 covers the entire first metal layer 18 but leaves a top surface of the second portion 22 of the first metal layer 18 exposed. The dielectric layer 23 is made of an appropriate electrically insulating material, for example, silicon oxide, silicon nitride or an organic material. The dielectric layer 23 has a thickness $d_3$ over the first portion 21 of the first metal layer 18 in the range from 0.5 to 5 μm and, in particular, in the range from 2 to 3 μm. The dielectric layer 23 electrically insulates the first metal layer 18 from the second metal layer 19.

The second metal layer 19 is applied over the first portion 21 of the first metal layer 18. In one embodiment, the second metal layer 19 has a thickness $d_4$ in the range from 1 to 10 μm and, in particular, in the range from 5 to 10 μm. Any desired metal or metal alloy, for example, aluminum, nickel or copper may be used for the second metal layer 19. The second metal layer 19 need not be homogenous or manufactured from just one material, that is to say various compositions and concentrations of the materials contained in the second metal layer 19 are possible.

In one embodiment, a passivation layer 25 is deposited over the dielectric layer 23. The passivation layer 25 leaves at least portions of the top surfaces of the second portion 22 of the first metal layer 18, the second metal layer 19 and the control electrode 16 exposed. The passivation layer 25 is made of an appropriate electrically insulating material, for example, silicon oxide, silicon nitride or an organic material. Since the passivation layer 25 overlaps the top surface of the second portion 22 of the first metal layer 18 and the top surface of the second metal layer 19, the creepage distance between the first metal layer 18 and the second metal layer 19 is increased.

The control electrode 16 and the second load electrode 17 may include one or more metal layers that are applied to the semiconductor substrate 13 (not shown in FIG. 1). The metal layers may be manufactured with any desired geometric shape and any desired material composition. Any desired metal or metal alloy, for example, aluminum, titanium, gold, silver, copper, palladium, platinum, nickel, chromium or nickel vanadium, may be used as the material.

The power semiconductor chip 10 is configured as a power transistor, for example, a power MOSFET, IGBT, JFET or power bipolar transistor. In the case of a power MOSFET or a JFET, the first load electrode 15 is a source electrode, the second load electrode 17 is a drain electrode, and the control electrode 16 is a gate electrode. In the case of an IGBT, the first load electrode 15 is an emitter electrode, the second load electrode 17 is a collector electrode, and the control electrode 16 is a gate electrode. In the case of a power bipolar transistor, the first load electrode 15 is an emitter electrode, the second load electrode 17 is a collector electrode, and the control electrode 16 is a base electrode. During operation, voltages higher than 5, 50, 100, 500 or 1000 V may be applied between the first and second load electrodes 15, 17. The switching frequency applied to the control electrode 16 may be in the range from 1 kHz to 100 MHz, but may also be outside this range.

FIG. 2 schematically illustrates a cross-sectional view of an active transistor cell 14 as included in the semiconductor substrate 13 of the power semiconductor chip 10. The transistor cell 14 illustrated in FIG. 2 is a VDMOS (Vertical Diffused MOS) cell. The transistor cell 14 has n- or p-doped regions as illustrated in FIG. 2. The transistor cell 14 may extend from the top face to the bottom face of the semiconductor substrate 13 (for simplicity, the transistor cells 14 are only depicted on the top surface of the semiconductor substrate 13 in FIG. 1). The transistor cell 14 has a source contact S and a gate contact G on the top face of the semiconductor substrate 13 and a drain contact D on the bottom face of the semiconductor substrate 13. The power transistor circuit included in the power semiconductor chip 10 of FIG. 1 is composed of several hundred or several thousand of the active transistor cells 14 illustrated in FIG. 2. The source contacts S and the drain contacts D of the transistor cells 14 are electrically coupled to the first and second load electrodes 15 and 17, respectively. The gate contacts G of the transistor cells 14 are electrically coupled to the control electrode 16.

Figure 3F:
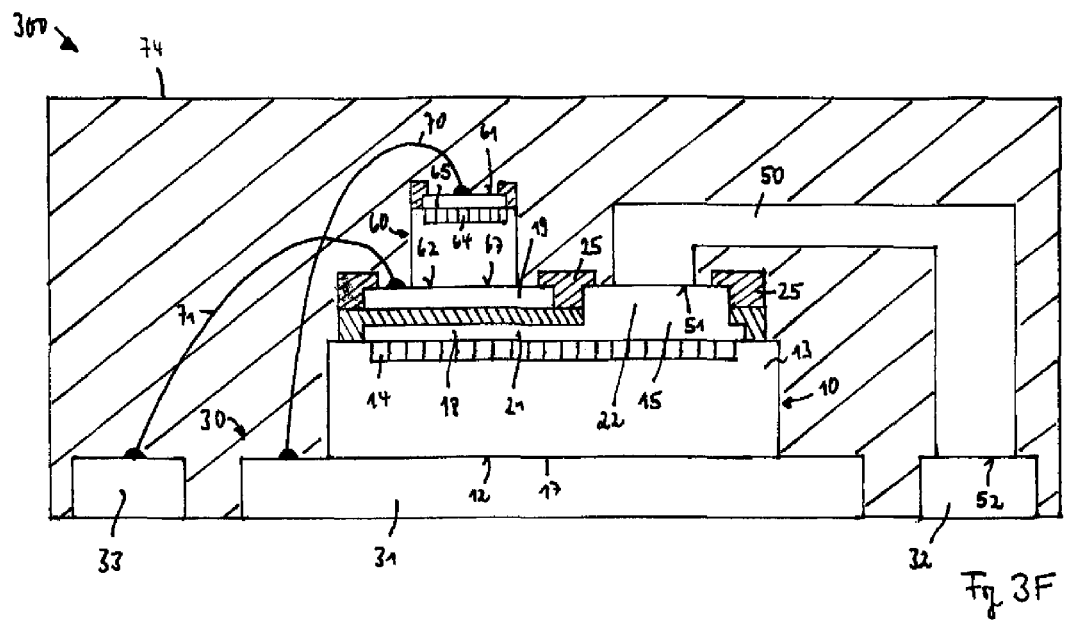

FIGS. 3A-3F, collectively FIG. 3, schematically illustrate an embodiment of a method of manufacturing a device 300, which is illustrated in FIG. 3F.

FIG. 3A schematically illustrates a leadframe 30, which is illustrated in a top plan view (bottom) and a cross-sectional view (top) along a line A-A' depicted in the top plan view. The leadframe 30 includes a die pad 31, a first lead 32, a second lead 33, a third lead 34 and a fourth lead 35. The die pad 31 and the leads 32-35 may be linked by dams (tie bars), which are not illustrated in FIG. 3A for reasons of clarity. In one embodiment, the leadframe 30 includes further die pads and leads.

The leadframe 30 is manufactured from metals or metal alloys, in particular copper, copper alloys, iron nickel, aluminum, aluminum alloys, or other electrically conductive materials. In one embodiment, the leadframe 30 is plated with an electrically conductive material, for example, copper, silver, iron nickel or nickel phosphorus. The shape of the leadframe 30 is not limited to any size or geometric shape. For example, the leadframe 30 may have a thickness in the range from 100 μm to 1 mm or may be even thicker. The leadframe 30 may have been manufactured by punching, milling or stamping a metallic plate.

FIG. 3B schematically illustrates a first power semiconductor chip 10, which is identical to the power semiconductor chip 10 illustrated in FIG. 1 and is mounted on the die pad 31. In one embodiment, further power semiconductor chips are mounted on further die pads of the leadframe 30, which are not illustrated in FIG. 3B.

The first power semiconductor chip 10 is mounted on the die pad 31 with its second face 12 facing the die pad 31 and its first face 11 facing away from the die pad 31. In one embodiment, the second load electrode 17 of the first power semiconductor chip 10 is electrically and mechanically coupled to the die pad 31 by diffusion soldering. For that, solder material is deposited on the second load electrode 17 or the upper surface of the die pad 31, for example, by sputtering or other appropriate physical or chemical deposition methods (not illustrated in FIG. 3B). In one embodiment, the solder material is deposited on the second load electrode 17 when the first power semiconductor chip 10 is still in the wafer bond, which means that the solder material is deposited on the semiconductor wafer before the semiconductor wafer is singulated in order to produce individual semiconductor chips. In one embodiment, the solder material consists of AuSn, AgSn, CuSn, Sn, AuIn, AgIn, AuSi or CuIn.

For producing the soldered joint, the leadframe 30 is heated by a hot plate to a temperature above the melting temperature of the solder material. For example, the leadframe 30 is heated to a temperature in the range from 200 to 400° C. and, in particular, in the range from 280 to 320° C. In one embodiment, both the leadframe 30 and the first power semiconductor chip 10 are placed in an oven and are heated to an appropriate temperature. A pick-and-place tool is used capable of picking the first power semiconductor chip 10 and placing it on the die pad 31. During the soldering process the first power semiconductor chip 10 may be pressed onto the die pad 31 for an appropriate time in the range from 10 to 200 ms, in particular around 50 ms.

During the diffusion soldering process the solder material produces a metallic joint between the die pad 31 and the first power semiconductor chip 10 which is able to withstand high temperatures through the fact that the solder material forms a temperature-resistant and highly mechanically stable intermetallic phase with high-melting materials of the die pad 31 and the first power semiconductor chip 10. The intermetallic phase has a higher melting temperature than the solder material used to generate the intermetallic phase. In the process, the low-melting solder material is completely transformed, i.e., it passes completely into the intermetallic phase.

In one embodiment, an electrically conductive adhesive is employed to attach the first power semiconductor chip 10 to the die pad 31. The adhesive may be based on filled or unfilled polyimides, epoxy resins, acrylate resins, silicone resins or mixtures thereof and be enriched with gold, silver, nickel or copper particles in order to produce the electrical conductivity.

FIG. 3C schematically illustrates layers 40, 41 and 42 of solder material which are deposited on at least portions of the second portion 22 of the first metal layer 18, the first lead 32 and the second metal layer 19, respectively. In one embodiment, the layers 40-42 of solder material are deposited after the soldered joint between the die pad 31 and the first power semiconductor chip 10 has been formed. The layers 40-42 of solder material are deposited by using printing, dispensing or any other appropriate technique. In one embodiment, the first and second metal layers 18, 19 of the first power semiconductor chip 10 are at least coated with a layer of nickel or copper or any other metal or metal alloy which allows to produce a soldered joint in a diffusion soldering process. In addition, a layer of silver or gold may be deposited on the nickel or copper layer having a thickness in the range from 10 to 200 nm. The silver or gold layer prevents the nickel or copper layer from oxidation.

FIG. 3D schematically illustrates a contact clip 50 which is mounted on the first power semiconductor chip 10 and the first lead 32. The contact clip 50 has a first contact area 51 which faces the second portion 22 of the first metal layer 18 and a second contact area 52 which faces the first lead 32. In addition, a second power semiconductor chip 60 is mounted on the second metal layer 19 of the first power semiconductor chip 10. Due to the second metal layer 19, which is electrically insulated from the first metal layer 18, the second power semiconductor chip 60 can be stacked on top of the first power semiconductor chip 10 and, in addition, active transistor cells 14 can be arranged in the semiconductor substrate 13 in the area 20 below the second power semiconductor chip 60.

The contact clip 50 is manufactured from a metal or a metal alloy, in particular, copper, copper alloys, iron nickel or other appropriate electrically conductive materials. The shape of the contact clip 50 is not limited to any size or geometric shape. The contact clip 50 may have the shape as exemplarily illustrated in FIG. 3D, but any other shape is also possible. The contact clip 50 is fabricated by stamping, punching, pressing, cutting, sawing, milling or any other appropriate technique.

The second power semiconductor chip 60 has a first face 61 and a second face 62 opposite to the first face 61. The second power semiconductor chip 60 includes a semiconductor substrate 63 and a power transistor circuit that is integrated in the semiconductor substrate 63 and includes a plurality of active transistor cells 64. In addition, the second power semiconductor chip 60 includes a first load electrode 65 and a control electrode 66 arranged on the first face 61 and a second load electrode 67 arranged on the second face 62. The second power semiconductor chip 60 is configured as a power transistor, for example, a power MOSFET, IGBT, JFET or power bipolar transistor. In the case of a power MOSFET or a JFET, the first load electrode 65 is a source electrode, the second load electrode 67 is a drain electrode, and the control electrode 66 is a gate electrode. In the case of an IGBT, the first load electrode 65 is an emitter electrode, the second load electrode 67 is a collector electrode, and the control electrode 66 is a gate electrode. In the case of a power bipolar transistor, the first load electrode 65 is an emitter electrode, the second load electrode 67 is a collector electrode, and the control electrode 66 is a base electrode. During operation, voltages higher than 5, 50, 100, 500 or 1000 V may be applied between the first and second load electrodes 65, 67. The switching frequency applied to the control electrode 66 may be in the range from 1 kHz to 100 MHz, but may also be outside this range.

Each of the first and second load electrodes 65, 67 and the control electrode 66 may include one or more metal layers that are applied to the semiconductor substrate 63. The metal layers may be manufactured with any desired geometric shape and any desired material composition. Any desired metal or metal alloy, for example, aluminum, titanium, gold, silver, copper, palladium, platinum, nickel, chromium or nickel vanadium, may be used as the material. Further, the base area of the second power semiconductor chip 60 is smaller than the exposed top surface of the second metal layer 19 such that the second power semiconductor chip 60 is placed completely within the outline of the portion of the second metal layer 19 that is exposed from the passivation layer 25.

The contact clip 50 and the second power semiconductor chip 60 are placed on the first power semiconductor chip 10 and the first lead 32 such that the first and second contact areas 51, 52 are placed over the layers 40 and 41 of solder material, respectively, and the second face 62 of the second power semiconductor chip 60 is placed over the layer 42 of solder material. Subsequently, the leadframe 30 together with the first and second power semiconductor chips 10, 60 and the contact clip 50 are placed in an oven. In the oven, the components are exposed to a temperature which is higher than the melting temperature of the solder material of the layers 40-42. The melting temperature of the solder material may be lower than 260° C. and, in particular, may be around 230° C. The temperature in the oven may be in the range from 280 to 320° C. and, in particular, around 300° C.

In the oven, a diffusion soldering process is carried out. During the diffusion soldering process the solder material produces metallic joints between the first contact area 51 and the first metal layer 18, between the second contact area 52 and the first lead 32 and between the second power semiconductor chip 60 and the second metal layer 19.

In one embodiment, an electrically conductive adhesive is employed to attach the contact clip 50 and the second power semiconductor chip 60 to the first semiconductor chip 10 and the first lead 32. The adhesive may be based on filled or unfilled polyimides, epoxy resins, acrylate resins, silicone resins or mixtures thereof and be enriched with gold, silver, nickel or copper particles in order to produce the electrical conductivity.

FIG. 3E schematically illustrates bond wires 70-73 that establish an electrical interconnection between the first and second power semiconductor chips 10, 60 and the leadframe 30. The bond wire 70 electrically couples the first load electrode 65 of the second power semiconductor chip 60 to the die pad 31, the bond wire 71 electrically couples the second metal layer 19 (and thus the second load electrode 67 of the second power semiconductor chip 60) to the second lead 33, the bond wire 72 electrically couples the control electrode 66 of the second power semiconductor chip 60 to the fourth lead 35, and the bond wire 73 electrically couples the control electrode 16 of the first power semiconductor chip 10 to the third lead 34. For example, ball bonding or wedge bonding is used as the interconnect technique to produce the bond wires 70-73. The bond wires 70-73 are made of gold, aluminum, copper or any other appropriate electrically conductive material.

FIG. 3F schematically illustrates a mold material 74 that encapsulates the components arranged on the leadframe 30. The mold material 74 may encapsulate any portion of the device 300, but leaves the lower surfaces of the die pad 31 and the leads 32-35 uncovered. The uncovered surfaces of the die pad 31 and the leads 32-35 may serve as external contact surfaces to electrically couple the device 300 to other components, for example, a circuit board, such as a PCB (Printed Circuit Board). The mold material 74 may be composed of any appropriate thermoplastic or thermosetting material, in particular, it may be composed of a material commonly used in contemporary semiconductor packaging technology. Various techniques may be employed to cover the components of the device 300 with the mold material 74, for example, compression molding, injection molding, powder molding or liquid molding.

Before or after the encapsulation with the mold material 74, the individual devices 300 are separated from one another by separation of the leadframe 30, for example, by sawing or cutting the dams of the leadframe 30. Other separation methods, such as etching, milling, laser ablation or stamping, may also be employed.

It is obvious to a person skilled in the art that the device 300 is only intended to be an exemplary embodiment, and many variations are possible. Although the device 300 in the embodiment illustrated in FIG. 3F includes exactly two semiconductor chips, the device 300 may include further semiconductor chips and/or passives. The semiconductor chips and passives may differ in function, size, manufacturing technology etc. For example, a semiconductor chip controlling the first and second power semiconductor chips 10, 60 may be included in the device 300.

Figure 4:
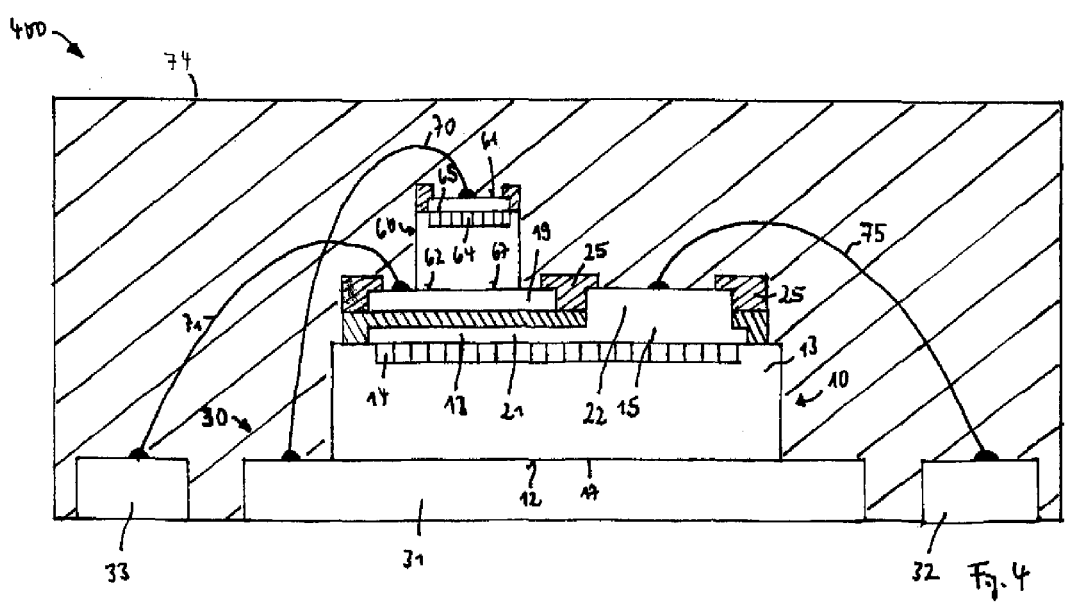
FIG. 4 schematically illustrates a cross-sectional view of one embodiment of a device including two power semiconductor chips stacked on a leadframe and bond wires electrically coupling the two power semiconductor chips to the leadframe.

FIG. 4 schematically illustrates a cross-sectional view of a device 400 that is almost identical to the device 300 illustrated in FIG. 3F. The difference is that the device 400 contains a bond wire 75 rather than the contact clip 50 to electrically couple the first load electrode 15 of the first power semiconductor chip 10 to the first lead 32. It may also be provided that further bond wires are connected between the first load electrode 15 and the first lead 32.

Figure 5:
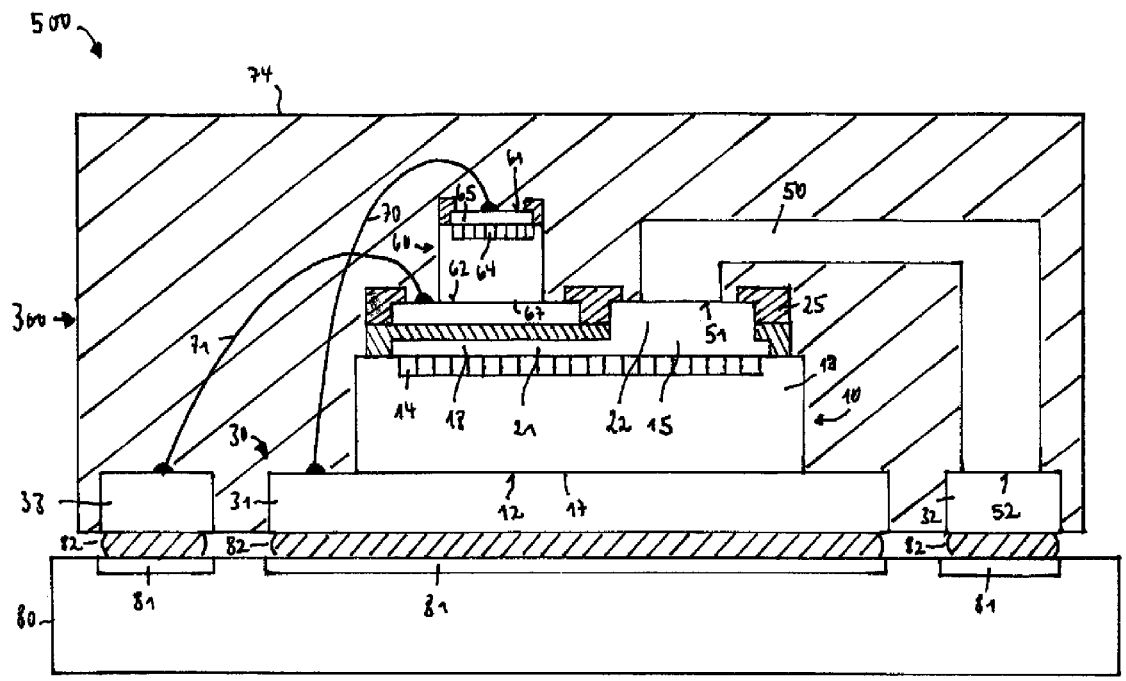
FIG. 5 schematically illustrates a cross-sectional view of one embodiment of a system including a semiconductor device mounted on a circuit board.

FIG. 5 schematically illustrates a cross-sectional view of a system 500 including the device 300 mounted on a circuit board 80, for example, a PCB. The circuit board 80 includes contact pads 81 to which the exposed surfaces of the die pad 31 and the leads 32-35 are attached using solder deposits 82.

Figure 6:
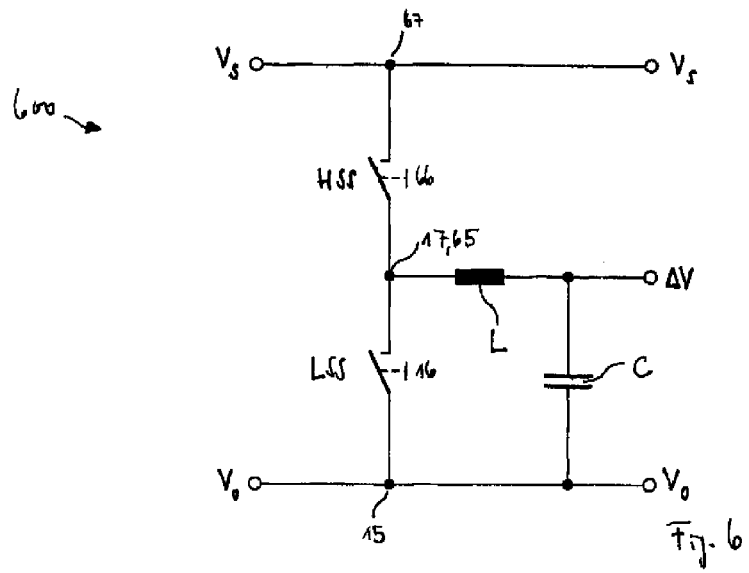
FIG. 6 illustrates a schematic basic circuit of a half-bridge circuit.

FIG. 6 illustrates a schematic basic circuit of a half-bridge circuit 600 having two switches, a high-side switch HSS and a low-side switch LSS, which are connected in series between a supply voltage $V_S$ and a ground potential $V_0$. In one embodiment, the half-bridge circuit 600 is implemented using the device 300 or 400. In this embodiment, the first power semiconductor chip 10 is the low-side switch LSS and the second power semiconductor chip 60 is the high-side switch HSS. The high-side switch HSS is connected by its second load electrode 67 (which is a drain electrode in case of the second power semiconductor chip 60 being a power MOSFET) to the supply voltage $V_s$ and is switched with the aid of its control electrode 66 (a gate electrode in case of a power MOSFET). The first load electrode 65 of the high-side switch HSS (a source electrode in case of a power MOSFET) forms, together with the second load electrode 17 of the low-side switch LSS (which is a drain electrode in case the first power semiconductor chip 10 being a power MOSFET), a serial node, which is coupled to the ground potential $V_0$ via the low-side switch LSS with the first load electrode 15 thereof (a source electrode in case of a power MOSFET) if the control electrode 16 turns on the low-side switch LSS (a gate electrode in case of a power MOSFET). The node coupled to the first load electrode 65 of the high-side switch HSS and the second load electrode 17 of the low-side switch LSS is coupled to a voltage output AV via a low pass-filter including an inductance L and a smoothing capacitor C. The inductance L and the smoothing capacitor C may be implemented inside or outside of the devices 300 and 400.

The half-bridge circuit 600 may, for example, be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage. Frequencies of several MHz or higher may be applied to DC-DC converters. Furthermore, currents of up to 50 A or even higher may flow through the DC-DC converters.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor chip, comprising:
    a power transistor circuit comprising a plurality of active transistor cells;
    a first load electrode and a control electrode arranged on a first face of the semiconductor chip, wherein the first load electrode comprises a first metal layer;
    a second load electrode arranged on a second face of the semiconductor chip; and
    a second metal layer arranged over the first metal layer, wherein the second metal layer is electrically insulated from the power transistor circuit and the second metal layer is arranged over an area of the power transistor circuit that comprises at least one of the plurality of active transistor cells.

2. The semiconductor chip of claim 1, wherein the first metal layer has a first portion with a first thickness and a second portion with a second thickness, wherein the first thickness is smaller than the second thickness.

3. The semiconductor chip of claim 2, wherein the second metal layer is arranged over the first portion of the first metal layer.

4. The semiconductor chip of claim 2, wherein a difference between the first thickness and the second thickness is between 3 µm to 8 µm.

5. The semiconductor chip of claim 2, wherein a surface of the second portion of the first metal layer is coplanar with a surface of the second metal layer.

6. The semiconductor chip of claim 1, further comprising a dielectric layer arranged between the first metal layer and the second metal layer.

7. The semiconductor chip of claim 1, wherein the semiconductor chip is a power MOSFET, an IGBT, a JFET or a power bipolar transistor.

8. A device, comprising:
    a first power semiconductor chip, comprising:
        a power transistor circuit comprising a plurality of active transistor cells;
        a first load electrode and a control electrode arranged on a first face of the first power semiconductor chip, wherein the first load electrode comprises a first metal layer;
        a second load electrode arranged on a second face of the first power semiconductor chip;
        a second metal layer arranged over the first metal layer, wherein the second metal layer is arranged over an area of the power transistor circuit that comprises at least one of the plurality of active transistor cells; and
        a dielectric layer arranged between the first metal layer and the second metal layer, wherein the dielectric layer electrically insulates the first metal layer from the second metal layer; and
    a second power semiconductor chip mounted on the second metal layer.

9. The device of claim 8, wherein the second power semiconductor chip comprises a first load electrode and a control electrode on a first face and a second load electrode on a second face.

10. The device of claim 9, wherein the second power semiconductor chip is mounted on the second metal layer with its second face facing the second metal layer.

11. The device of claim 9, wherein the second load electrode of the first power semiconductor chip is electrically coupled to the first load electrode of the second power semiconductor chip.

12. The device of claim 8, further comprising a die pad, wherein the first power semiconductor chip is mounted on the die pad with its second face facing the die pad.

13. The device of claim 12, wherein the second power semiconductor chip comprises a first load electrode and a control electrode on a first face and a second load electrode on a second face, the device further comprising a bond wire electrically coupling the first load electrode of the second power semiconductor chip to the die pad.

14. The device of claim 8, wherein the first metal layer has a first portion with a first thickness and a second portion with a second thickness, wherein the first thickness is smaller than the second thickness.

15. The device of claim 14, wherein the second metal layer is arranged over the first portion of the first metal layer.

16. The device of claim 14, wherein a difference between the first thickness and the second thickness is between 3 µm and 8 µm.

17. The device of claim 14, wherein a surface of the second portion of the first metal layer is coplanar with a surface of the second metal layer.

18. A half-bridge circuit, comprising:
a low-side switch, comprising:
a semiconductor substrate;
a power transistor circuit embedded in the semiconductor substrate and comprising a plurality of active transistor cells;
a first load electrode and a control electrode arranged on a first face of the semiconductor substrate, wherein the first load electrode comprises a first metal layer;
a second load electrode arranged on a second face of the semiconductor substrate;
a second metal layer arranged over the first metal layer, wherein the second metal layer is arranged over an area of the power transistor circuit that comprises at least one of the plurality of active transistor cells; and
a dielectric layer arranged between the first metal layer and the second metal layer, wherein the dielectric layer electrically insulates the first metal layer from the second metal layer; and
a high-side switch mounted on the second metal layer.

19. The half-bridge circuit of claim 18, wherein the low-side switch and the high-side switch are power MOSFETs, IGBTs, JFETs or power bipolar transistors.

20. A method of manufacturing a device, the method comprising:
providing a leadframe comprising a die pad and a plurality of leads;
mounting a first power semiconductor chip on the die pad, the first power semiconductor chip comprising:
a power transistor circuit comprising a plurality of active transistor cells;
a first load electrode and a control electrode arranged on a first face of the first power semiconductor chip, wherein the first load electrode comprises a first metal layer;
a second load electrode arranged on a second face of the first power semiconductor chip; and
a second metal layer arranged over the first metal layer, wherein the second metal layer is electrically insulated from the power transistor circuit and the second metal layer is arranged over an area of the power transistor circuit that comprises at least one of the plurality of active transistor cells; and
mounting a second power semiconductor chip on the second metal layer.

21. The method of claim 20, further comprising:
depositing solder material on the second metal layer after mounting the first power semiconductor chip on the die pad and before mounting the second power semiconductor chip on the second metal layer.

22. The method of claim 21, wherein a diffusion soldering process is used to mount the second power semiconductor chip on the second metal layer.

23. The method of claim 20, further comprising:
providing a contact clip comprising a first contact area and a second contact area;
attaching the first contact area to the first metal layer; and
attaching the second contact area to one of the plurality of leads.

24. The method of claim 23, further comprising:
depositing solder material on the first metal layer and the leads after mounting the first power semiconductor chip on the die pad and before attaching the contact clip to the first metal layer and the leads.

* * * * *